(12) United States Patent
Yang

(10) Patent No.: US 9,190,294 B2
(45) Date of Patent: Nov. 17, 2015

(54) METHODS AND APPARATUS FOR SEPARATING A SUBSTRATE

(71) Applicant: Michael Xiaoxuan Yang, Palo Alto, CA (US)

(72) Inventor: Michael Xiaoxuan Yang, Palo Alto, CA (US)

(*) Notice: Subject to any disclaimer, the term of this patent is extended or adjusted under 35 U.S.C. 154(b) by 215 days.

(21) Appl. No.: 13/694,525

(22) Filed: Dec. 10, 2012

(65) Prior Publication Data

US 2014/0053382 A1    Feb. 27, 2014

Related U.S. Application Data

(60) Provisional application No. 61/742,975, filed on Aug. 23, 2012.

(51) Int. Cl.
| | |
|---|---|
| H01L 21/78 | (2006.01) |
| H01L 21/46 | (2006.01) |
| H01L 21/67 | (2006.01) |
| H01L 21/463 | (2006.01) |
| B28D 5/00 | (2006.01) |
| B23K 26/00 | (2014.01) |
| B23K 26/073 | (2006.01) |
| B23K 26/36 | (2014.01) |
| B23K 26/40 | (2014.01) |

(52) U.S. Cl.
CPC .......... *H01L 21/46* (2013.01); *B23K 26/0087* (2013.01); *B23K 26/0736* (2013.01); *B23K 26/367* (2013.01); *B23K 26/4075* (2013.01); *B28D 5/00* (2013.01); *H01L 21/463* (2013.01); *H01L 21/67* (2013.01); *H01L 21/78* (2013.01); *Y10T 29/41* (2015.01)

(58) Field of Classification Search
CPC ....... H01L 21/78; H01L 21/461; H01L 21/46; H01L 21/463; H01L 21/67
USPC .............. 219/121.62; 257/626; 438/463–465
See application file for complete search history.

(56) References Cited

U.S. PATENT DOCUMENTS

| | | | | |
|---|---|---|---|---|
| 6,664,552 | B2 * | 12/2003 | Shichi et al. | 250/492.21 |
| 7,098,454 | B2 * | 8/2006 | Kuhlman et al. | 250/307 |
| 7,135,384 | B2 * | 11/2006 | Takyu et al. | 438/460 |
| 7,682,937 | B2 * | 3/2010 | Evertsen et al. | 438/462 |
| 8,071,960 | B2 * | 12/2011 | Hoeche | 250/440.11 |
| 8,168,514 | B2 * | 5/2012 | Garner et al. | 438/463 |
| 8,419,895 | B2 * | 4/2013 | Dang et al. | 156/703 |
| 2007/0173036 | A1 * | 7/2007 | Kusunoki | 438/465 |
| 2008/0050888 | A1 * | 2/2008 | Garner et al. | 438/463 |
| 2008/0314879 | A1 * | 12/2008 | Bruland et al. | 219/121.62 |

(Continued)

FOREIGN PATENT DOCUMENTS

| | | | |
|---|---|---|---|
| JP | 01077507 | * | 3/1989 |
| JP | 06232258 | * | 8/1994 |

*Primary Examiner* — Michael Lebentritt

(57) ABSTRACT

This invention relates to slicing a thin semiconductor substrate from side wall into two substrates of half thickness. The substrate slicing process involves a laser irradiation step. The apparatus for substrate slicing comprises two opposite-facing substrate chucks, with a gap in between for the substrate to pass through.

The present invention is further directed to methods and apparatus of separating a continuous thin layer of materials from side wall of a rotating ingot. It can be accomplished by a laser irradiation on the ingot side wall from a tangential direction. A film can be deposited on/bonded to the ingot side wall prior to the separation of the thin film layers. The resulting thin layer of materials can be pulled away from the ingot by a substrate chuck.

21 Claims, 7 Drawing Sheets

(56) References Cited

U.S. PATENT DOCUMENTS

| | | | |
|---|---|---|---|
| 2009/0277314 A1* | 11/2009 | Henley | 83/15 |
| 2010/0203706 A1* | 8/2010 | Ohnuma et al. | 438/458 |
| 2011/0121207 A1* | 5/2011 | Brailove | 250/492.21 |
| 2012/0111838 A1* | 5/2012 | Zafiropoulo et al. | 219/121.65 |
| 2013/0251940 A1* | 9/2013 | Sun et al. | 428/131 |
| 2014/0038392 A1* | 2/2014 | Yonehara et al. | 438/463 |
| 2015/0170967 A1* | 6/2015 | Yang | 438/463 |

* cited by examiner

METHODS AND APPARATUS FOR SEPARATING A SUBSTRATE

CROSS REFERENCE TO RELATED APPLICATION

The present invention claims priority to U.S. Provisional Application No. 61/742,975 filed Aug. 23, 2012.

FIELD OF THE INVENTION

The present invention relates to fabrication of substrates for electronics, optoelectronics and microelectromechanical systems (MEMS) devices. The present invention also relates to handling of semiconductor substrates, and materials processing by laser irradiations.

BACKGROUND OF THE INVENTION

Substrates for use in the field of electronics, optoelectronics, and microelectromechanical systems (MEMS) devices are generally obtained by slicing/cutting/separating ingots. In the case of mono-crystalline silicon, for example, the ingots are obtained from a bath of molten silicon using the Czochralski (Cz) or the float zone (Fz) methods. These conventional methods produce cylindrical ingots which are cut by a circular or wire saw into slices perpendicular to the axis of the cylindrical ingot. The cut of the cylindrical ingots results in round wafers which are common for fabrication of general electronics and MEMS devices. In crystalline silicon solar cell production, silicon blocks are first prepared from the cylindrical ingots, before being cut into square or substantially square wafers.

Microprocessor and memory devices can function properly with less than one micron of silicon thickness. However, current silicon substrates in mass production are significantly thicker. 150 mm diameter silicon wafers have a standard thickness of ~675 microns, 200 mm diameter silicon wafers have a standard thickness of ~725 microns, and 300 mm diameter wafers have a standard thickness of ~775 microns. A silicon-on-insulator (SOI) process has been developed to laminate a sub-micron pristine silicon layer on top of another insulating substrate (such as another silicon wafer with an insulating silicon oxide top layer). An improvement of transistor switching speed and a reduction in transistor power consumption have been reported for integrated circuits fabricated on the SOI substrate.

In production of general electronic devices with integrated circuits, multiple devices are first fabricated on a single wafer, and the devices at this stage are known as dies on the wafers. After completion of the manufacturing flow, wafers are cut along x- and y-directions to isolate individual dies, before each functional die is packaged with proper encapsulation and input/output (I/O) connectors. Often the wafers are thinned down from backside before the wafer dicing step. The reduced substrate thickness can help to yield a lower profile in the final package. Thin dies can also be stacked up for additional functionalities or a more compact final packaging size, desirable in consumer electronics applications.

Wafer thinning is also adopted in fabrication of MEMS devices. MEMS devices such as micro-sensors and micro-actuators are usually manufactured on silicon wafers with process steps similar to fabrication of general electronic devices, with addition of mechanical components in dimensions of 1-100 microns. Silicon substrates of a thickness less than 100 microns are also flexible, suitable for some ultra light-weight, portable applications, e.g. new gadgets in curved or flexible forms.

In crystalline silicon solar cell production, <200 micron thick substrates (156 mm×156 mm or 125 mm×125 mm square) are common today, while ~150 micron substrate thickness are becoming available with the advanced wire-saw systems to cut silicon ingots/blocks. With a surface texturing, an anti-reflective coating (ARC) layer deposition on the front surface and a reflector layer deposition at the back surface, solar cells of 18-24% efficiency are currently manufactured on mono-crystalline silicon substrates of >150 microns thickness. With some advanced light trapping technologies, it is conceivable to maintain the high solar cell efficiency with a silicon substrate of 100 microns or less in thickness.

Silicon substrate cost often accounts for >50-60% of total manufacturing cost of mono-crystalline silicon solar cells. Thus there is a significant economical incentive to reduce silicon substrate thickness without reducing cell efficiency and without increasing manufacturing complexity/cost. However, current silicon substrate preparation technologies have their limitations. A cutting of hard materials such as silicon by wire saws is associated with a considerable consumable cost (cutting wires and slurries) and a significant kerf loss, i.e. the amount of silicon removed by cutting wires. Despite of the continuous improvements in wiresaw equipment, process and materials, it remains challenging to produce wafers of less than 100 microns thickness with a kerf loss of less than 100 microns.

Alternative technologies have been proposed for thin substrate fabrication in crystalline silicon solar cell production. In one method, ultrathin silicon wafers of less than 20 microns are produced by implantation of high energy hydrogen ions into silicon substrates, followed by a thermal or mechanical exfoliation. The idea is analogous to the commercial silicon-on-insulator (SOI) substrate technologies in advanced IC manufacturing. In another method, deposition of a thin metal (e.g. nickel) layer on the silicon substrate surface is followed by a low temperature anneal to form a thin metal silicide interface layer. A thin silicon wafer can then be exfoliated from the substrate by a mechanical wedge. Both silicon exfoliation methods can be repeated to produce multiple ultrathin silicon wafers (10-20 microns) from a single substrate with a negligible kerf loss.

Even though the silicon materials consumption can be lowered by the proposed silicon exfoliation technologies, hurdles exist for their adoption in mass production of solar cells. A reliable handling of ultrathin substrates of <50 micron thickness can be difficult. Different from wiresaw cutting of a silicon ingot which can produce multiple wafers in parallel, silicon wafers can only be exfoliated from the substrate one at a time. A periodic reconditioning of the substrate surface may also be necessary. As a result, manufacturing cost rises along with an increase of work-in-progress (WIP) inventory and cycle time. The ultrathin silicon substrates can also require some significant modifications in solar cell manufacturing processes. An ultrathin substrate requires a more sufficient light trapping to maintain a high solar cell efficiency, yet a proper surface texturing for efficient light trapping is difficult on a Si(111) surface, a preferred surface orientation for the silicon wafer exfoliation technologies. In addition, alternative metalization technologies may need to be developed to accommodate the fragile ultrathin silicon substrates.

The apparatus described in the present invention can comprise a laser unit. Different lasers have different active media for coherent light generation. The most common active media include gases (in gas lasers), rare-earth element doped crystals (in solid state lasers), and semiconductor materials (in semiconductor lasers). Other laser types include chemical lasers, dye lasers, metal vapor lasers, etc.

In a gas laser, an electrical circuit is discharged through a gas to produce a coherent light. For example, $CO_2$ lasers can emit hundreds of kilowatts at 10.6 microns, and are often used in industrial applications such as cutting and welding. Excimer lasers are a subgroup of gas lasers which are powered by a chemical reaction involving an excited dimer, or excimer. Common ultraviolet (UV) excimer lasers include $F_2$ laser (emitting at 157 nm), ArF laser (193 nm), KrCl laser (222 nm), KrF laser (248 nm), XeCl laser (308 nm), and XeF laser (351 nm).

In solid state lasers, a crystalline or glass rod is "doped" with ions for the required energy states in coherent light generation. Yttrium aluminum garnet (Nd:YAG), yttrium lithium fluoride (Nd:YLF) and yttrium orthovanadate (Nd:$YVO_4$) lasers can produce powerful pulses at 1064 nm. The laser intensity can be amplified through an optical fiber. The so called fiber lasers can deliver multi-kilowatt laser powers with an excellent electricity to laser power conversion efficiency, and have increasing industrial applications in cutting, welding and marking of metals and other materials. Common Diode Pumped Solid State (DPSS) lasers wavelengths are 1064 nm, frequency-doubled 532 nm (green), frequency-tripled 355 nm (UV) and frequency-quadrupled 266 nm (UV).

Semiconductor lasers are commonly known as laser diodes. The active medium in laser diodes is a semiconductor material with a p-n junction. The emitting wavelength of laser iodides can range from ~0.4 to 20 microns, with applications in telecommunications, holography, printing, and machining/welding. Laser iodides can also serve as pump sources for other lasers.

There are a number of laser applications in electronics device fabrications. The first group of applications is laser patterning/scribing. Laser patterning processes have been adopted in IC packaging and solar cell production, via a direct materials ablation process. A similar materials ablation process can also be used for laser dicing of wafers into individual dies. An alternative method for laser dicing involves focusing a high intensity laser beam inside the substrates. In the so-called Stealth Dicing process, the substrate materials is transparent to the laser irradiation of the basic frequency, but can be modified by a multi-photon absorption process at the laser converging point inside the substrate. After completion of the laser scan along the scribe lines, wafers are bonded to a supporting tape. When the supporting tape is stretched, dies can be separated with a near-zero kerf loss.

For silicon substrate, the preferred laser wavelength can be in the infrared (IR) range, exceeding 1 micron in wavelength. Frequency doubling is a non-linear photonic phenomenon, and is prominent under a high irradiation, e.g. at the focal point of a high power, short pulsed laser beam. In order to maximize the laser irradiation at the focal point, it can be advantageous to have a spot beam instead of a line beam.

Some other laser-based processes involve a melt or submelt of substrate materials. Applications include dopant activation on silicon wafers in advanced transistor fabrications, and amorphous silicon film crystallization on glass substrates as backplanes for high-resolution flat panel displays.

With a careful design of film stacks and a selection of suitable laser wavelength/power, a laser irradiation can also selectively melt a bonding layer and detach thin films/materials from the substrates. Applications include laser liftoff of LED dies from substrates (sapphire, silicon, etc.), and release of flexible displays from temporary carriers.

The present invention is also related to substrate handling in production of electronics devices. Substrates such as semiconductor wafers or large sheets of glass can be held in compliance to substrate chucks by an electrostatic force or a pressure delta between two sides of the substrates. Some substrate chucks are in a direct physical contact with the substrates. In other chuck designs, substrate chucks are in a close proximity to but not in a direct physical contact with the substrates. The non-contact substrate chucks often adopt a fluid-mechanical design and operate like a return spring. The working distance (between the substrates and the chuck) and stiffness of the chuck "spring" can be optimized. Substrates can also be transported across the surface of stationary non-contact chucks. In flat panel display panel production, non-contact fluid-mechanical chucks have been used for automation of glass substrates in coating, patterning, and optical inspection/metrology processes. In thin film solar production, non-contact fluid-mechanical chucks have been adopted in automation of substrates for laser scribing, etc.

SUMMARY OF THE INVENTION

This invention relates to apparatus of slicing a thin substrate from the side wall into two pieces of approximately half thickness. The apparatus for substrate slicing comprises two opposite-facing substrate chucks with a substrate moves through the opening in between. A portion of the two substrate chucks can be positioned parallel to each other for centering the substrate sidewall prior to the slicing. The gap between the two substrate chucks can increase as the substrate moves through the apparatus after being sliced into two pieces from the sidewall. In one embodiment, the substrate slicing involves a laser irradiation on substrate side wall. In another embodiment, the substrate slicing involves a laser irradiation on one side of the substrate. A substrate slicing apparatus can also comprise a mechanical cleaver to facilitate a mechanical separation of the substrate.

The present invention is further directed to methods and apparatus of separating a continuous thin layer of materials from side wall of a rotating ingot, either by a direct laser cutting, or by forming a plane of modified region underneath the ingot sidewall surface with a laser irradiation followed by a mechanical cleaving along the plane of modified region. A film can be deposited on/bonded to the ingot side wall prior to the separation of the thin film layers. The resulting thin layer of materials can be pulled away from the ingot by a substrate chuck.

BRIEF DESCRIPTIONS OF THE DRAWINGS

Embodiments are illustrated in the following detailed description and are not limited in the following figures.

Figure 5:
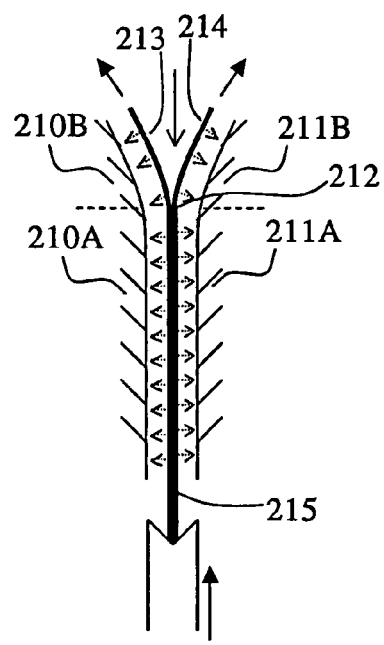

FIG. 5 illustrates a cross section in a diagrammatic view of an apparatus for substrate slicing, with a substrate passing through a gap between two substrate chucks and exposed to a laser irradiation at side wall of the substrate where one portion of the two chucks are in a general alignment parallel to each other, and another portion of the two chucks have an increasing gap in between at direction of substrate exiting the apparatus according to the present invention.

Figure 6:
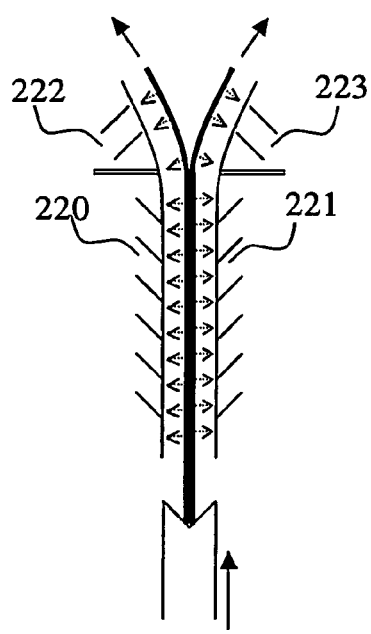

FIG. 6 illustrates a cross section in a diagrammatic view of an apparatus for laser irradiation and substrate slicing, with two pairs of substrate chucks, the first pair of the two chucks are in a general alignment parallel to each other, and the second pair of substrate chucks have an increasing gap in between at direction of substrate exiting the apparatus according to the present invention.

Figure 7:
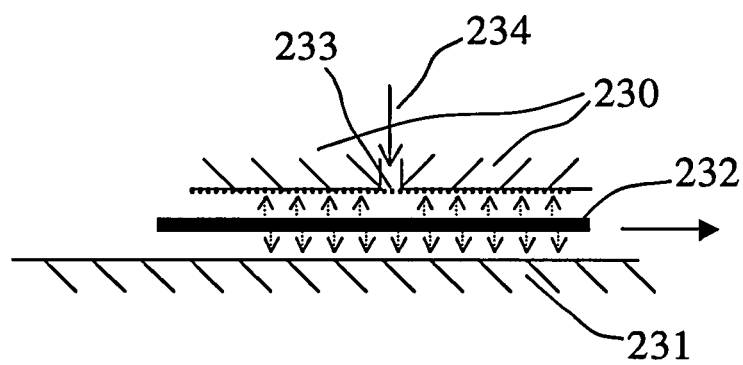

FIG. 7 illustrates a cross section in a diagrammatic view of an apparatus for laser irradiation, with a substrate passing through a gap between two substrate chucks, and with a laser irradiation through an aperture in one chuck onto the substrate, according to the present invention.

Figure 8:
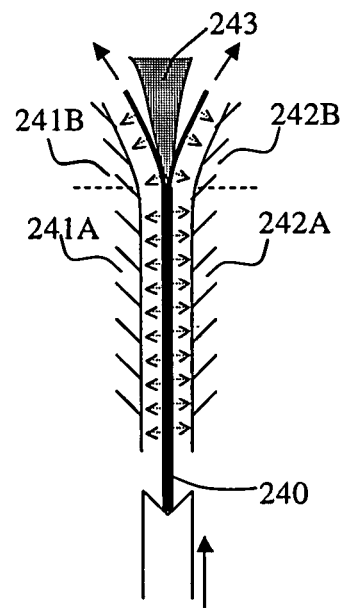

FIG. 8 illustrates a cross section in a diagrammatic view of an apparatus for substrate slicing, with a substrate passing through a gap between two substrate chucks, and the substrate is separated from middle of the side wall with assistance of a mechanical cleaver according to the present invention.

Figure 9:
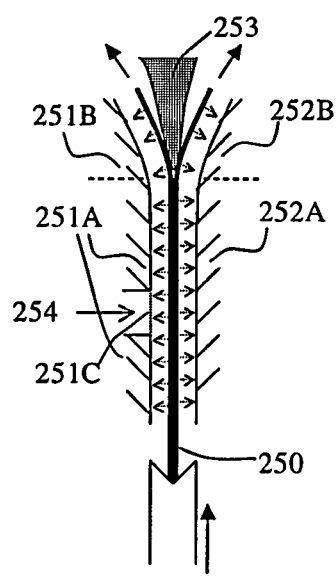

FIG. 9 illustrates a cross section in a diagrammatic view of an apparatus for substrate slicing, with a substrate passing through a gap between two substrate chucks, with a laser irradiation through an aperture in one chuck onto the substrate, and the substrate is separated from middle of the side wall with assistance of a mechanical cleaver according to the present invention.

Figure 10:
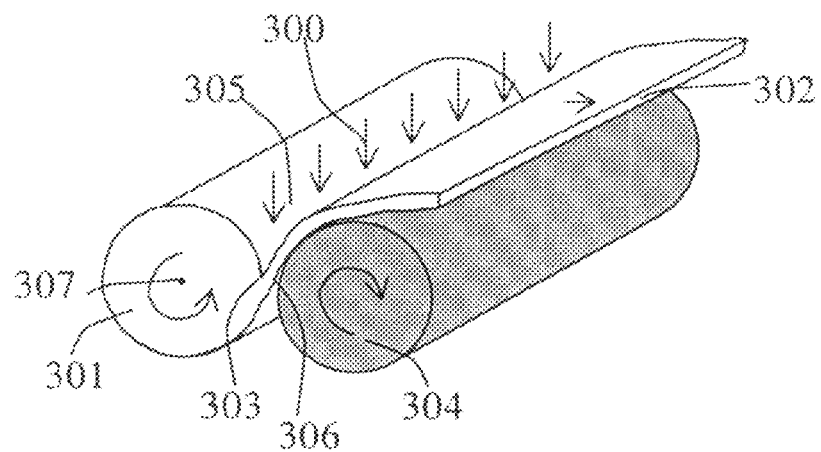

FIG. 10 illustrates a diagrammatic perspective view of an apparatus for materials separation, with a layer of semiconductor materials separated from side wall of a rotating ingot upon a laser irradiation according to the present invention.

Figure 11:
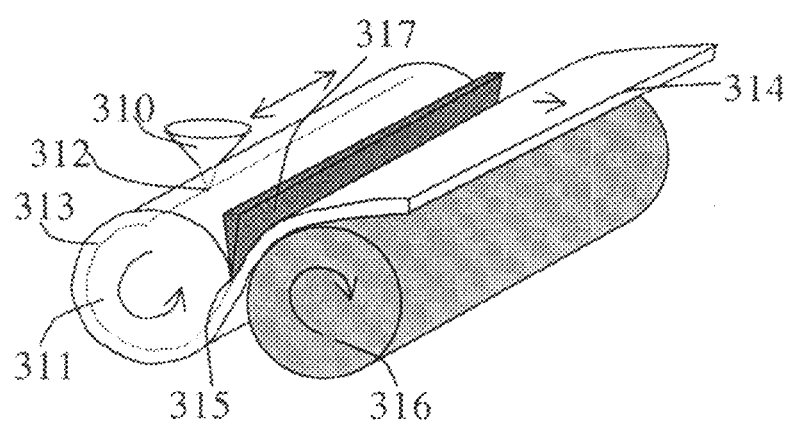

FIG. 11 illustrates a diagrammatic perspective view of an apparatus for materials separation, with a laser irradiation on the side wall of a rotating ingot, with a plane of modified region formed at converging point of the laser irradiation, and with a layer of materials separated from side wall of the ingot at the plane of modified region according to the present invention.

Figure 12:
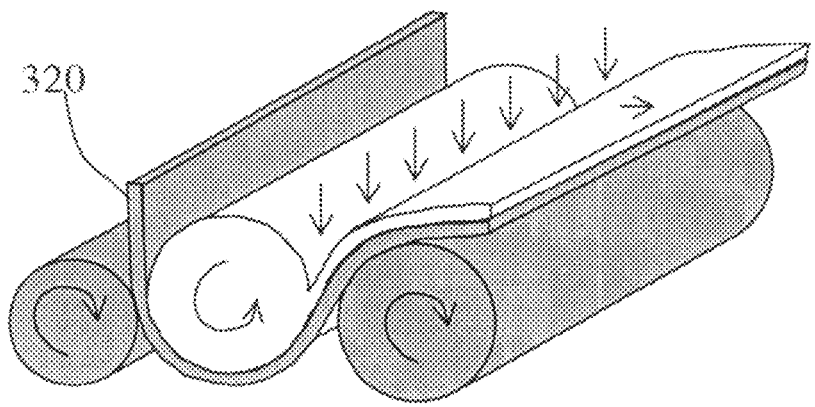

FIG. 12 illustrates a diagrammatic perspective view of an apparatus for materials separation, with bonding of a thin layer of support materials to side wall of a rotating ingot, prior to separation of a layer of semiconductor materials from the ingot side wall by a laser irradiation according to the present invention.

Figure 13:
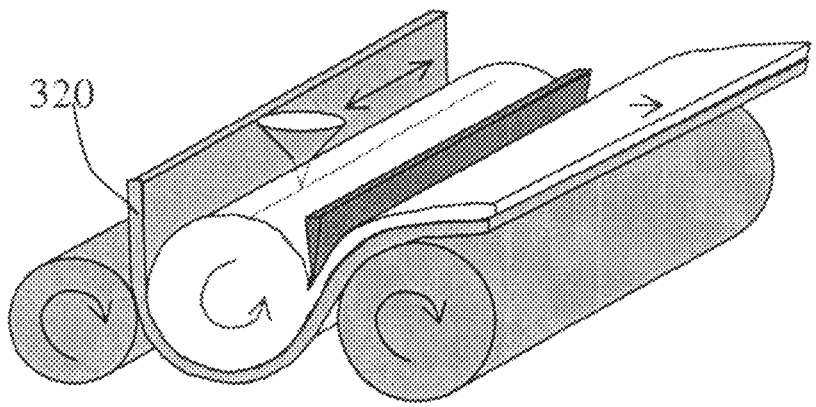

FIG. 13 illustrates a diagrammatic perspective view of an apparatus for materials separation, with a laser irradiation to form a plane of modified region underneath sidewall surface of a rotating ingot, bonding of a thin layer of support materials to the ingot side wall after the laser irradiation, and separation of a layer of materials from the ingot side wall at the plane of modified region according to the present invention.

DETAILED DESCRIPTION OF THE PREFERRED EMBODIMENTS

The following description in combination with the figures is provided to assist in understanding the teachings disclosed herein. The description focuses on specific implementations, embodiments and advantages of the teachings, and should not be interpreted as a limitation on the scope or applicability of the teachings.

Some embodiments of the present invention are directed to methods and apparatus for substrate separation in which a thin substrate (e.g. a semiconductor wafer) is sliced into two substrates, with the two resulting substrates possessing in general the same front/back surface area as the starting substrate.

The substrate slicing process is proposed in a related patent application for fabrication of electronics, optoelectronics and MEMS devices filed on same date herewith and claiming priority to the same provisional application. The proposed method is applicable to fabrication of double-sides devices, i.e. devices which functionality requires designs and fabrication of both sides of the substrate. Insertion of a substrate slicing step in the fabrication flow can reduce manufacturing complexity of the double-sided devices, lower production cost and potentially improve device performance. For instance, the proposed substrate slicing process can be adopted in existing crystalline silicon solar cell production lines and yield two solar cells of <100 micron thickness from a single starting substrate of <200 micron thickness, with a potentially significant reduction in production cost for each final solar cell.

The novel substrate slicing processes proposed in the related invention warrants a detailed consideration on the apparatus design. The intended applications requires slicing of a starting wafer as thin as 100-200 microns with a minimal kerf loss. To address the intended applications in solar cell and other electronic device fabrications, the apparatus needs to be able to handle thin substrates. Thin semiconductor substrates, such as silicon, can be both flexible and fragile. In addition, there can be a considerable thickness variation within a wafer and from wafer to wafer. Such with-in wafer and wafer-to-wafer thickness variation needs to be taken into account in the design of substrate slicing apparatus, as it can be desirable to have approximately the same thickness for two resulting wafers after the substrate slicing step.

Figure 1:
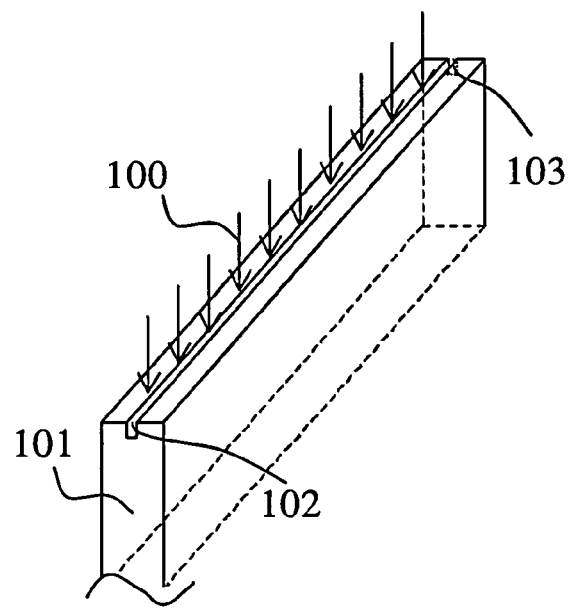
FIG. 1 illustrates a perspective view of a substrate subject to a laser irradiation at its side wall for substrate slicing.

As described in the related patent application, the substrate slicing process can be accomplished by a laser irradiation on the substrate side wall. As illustrated in FIG. 1, a very narrow groove can be cut on the side wall of a substrate 101 by a focused laser beam 100. It can be advantageous to have a laser beam 100 with a very narrow line profile, with a width of a few microns. Such narrow laser beam 100 can be produced with a short wavelength laser coupled with advanced laser optics. Applicable lasers can include but not limited to DPSS lasers and excimer lasers of ultraviolet wavelength. The length of the laser beam 100 can exceed the dimension of the substrate from Points 102 to 103. The laser beam can be also shaped in some other profiles, such as a short line, an elliptical spot or a circular spot. In addition, the laser beam can focus on a single spot, or several spots in an alignment to form a "broken" line, etc. In these scenarios, a laser irradiation across the entire width of the substrate (from Points 102 to 103) can be accomplished by scanning the laser beam or moving the substrate, in a general direction parallel to substrate front/back surfaces.

The substrate slicing can be completed with a continuous cut by laser irradiation in a general plane parallel to substrate front/back surfaces. In another method of the present invention, a laser irradiation can cut a groove on the substrate sidewall, before the substrate is cleaved by a mechanical cleaver from the groove.

Figure 2:
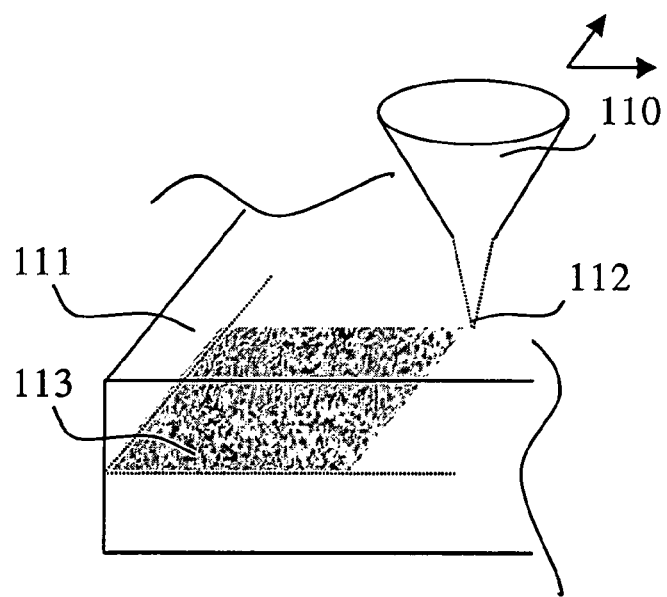
FIG. 2 illustrates a perspective view of a substrate subject to a laser irradiation with a converging point located within the substrate and the laser scanning across the substrate to form a plane of modified region for subsequent substrate slicing.

In another method, a substrate slicing process can comprise a laser irradiation on the surface instead of on the sidewall of the substrate. As illustrated in FIG. 2, laser beam 110 converges inside the substrate at a pre-determined depth under the substrate surface 111. Under proper conditions, a modified region can be formed inside the substrate at the laser focal point 112. The process is similar to that of laser Stealth Scribing as discussed later.

Scanning the laser focal point across the substrate at an approximately constant depth can form an embedded plane of modified region 113 in a general alignment parallel to the substrate surfaces 111. Such plane of modified region can have a mechanical strength significantly weaker than that of the single crystal materials. The substrate can be separated into two pieces at the plane of modified region in a subsequent substrate slicing step. The plane of the modified region can be set at a depth of approximately half of starting substrate thickness, for the two resulting substrates after the slicing being approximately equal in thickness.

A decoupled laser irradiation and substrate slicing processes can be advantageous in fabrication of electronics, optoelectronics and MEMS devices. An optimized device fabrication flow can include a few processes sandwiched in between the laser irradiation and substrate slicing steps.

Figure 3:
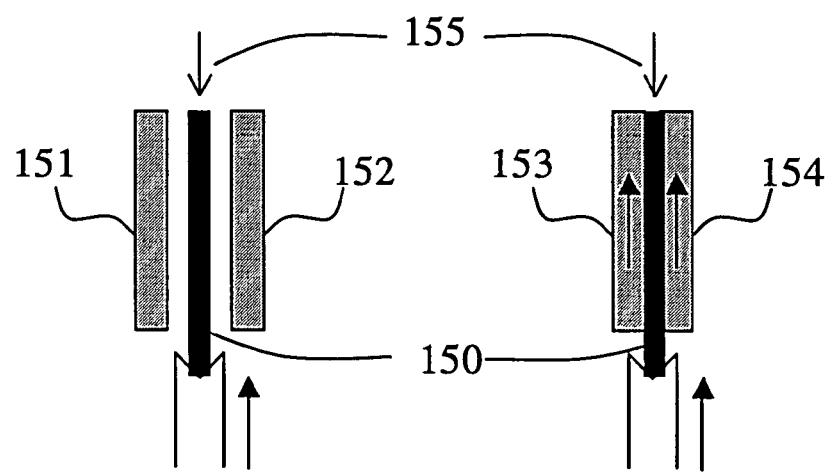
FIG. 3 illustrates two types of chuck assembly according to the present invention.

As illustrated in FIG. 3, one embodiment of the present invention describes an apparatus for substrate slicing from the side wall comprising two substrate chucks (151 and 152, 153 and 154) facing each other with a gap in between, and at least a portion of the two substrate chucks are in a general alignment parallel to each other. The substrate chucks can adopt either a non-contact (151/152) or a compliant-contact (153/154) design. As shown in FIG. 3, a semiconductor substrate 150 can pass through the gap between the two substrate chucks, with substrate surfaces in a general alignment with the substrate chuck surfaces. Non-contact substrate chucks (151/152) can stay stationary with the substrate passing through the gap in between. Compliant-contact substrate chucks (153/154), on the other hand, will have their surfaces move/rotate like conveyor belts along with the semiconductor substrate 150 in between. It is conceivable to have the two chucks mirror images in the designs. With a thin substrate in between, the two substrate chucks can work as two return springs in tandem to center the side wall of the substrate in between, and insensitive to substrate-to-substrate and with-in substrate thickness variations.

As discussed above, one portion of the two substrate chucks are in a general alignment parallel to each other. A substrate slicing from the side wall can be carried out with an energy source or a mechanical cleaver 155 positioned at end of the parallel section of the two substrate chucks, as shown in FIG. 3.

Figure 4:
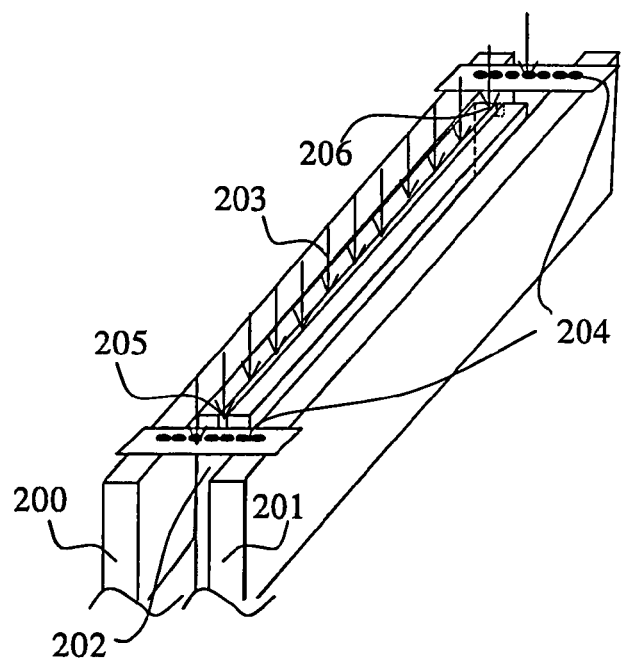
FIG. 4 illustrates a perspective view of a substrate slicing apparatus with a substrate passing through a gap between two substrate chucks and exposed to a laser irradiation at side wall of the substrate, with sensors for laser irradiation in the apparatus according to the present invention.

FIG. 4 illustrates a perspective view of a substrate slicing apparatus with a substrate 203 passing through a gap between two substrate chucks and exposed to a laser irradiation at side wall of the substrate. A laser line beam can focus on the center line of the substrate side wall for substrate slicing. In an embodiment of the invention, the apparatus can include sensor(s) 204 for laser irradiation. The laser irradiation sensor(s) 204 can be positioned across the gap between the two substrate chucks 200 and 201, at both ends of the substrate pass. The sensors 204 can monitor laser beam profile and stability. It can be advantageous to attach the laser irradiation sensor(s) 204 directly on the chuck assembly, and the signals from the sensor(s) 204 can be used to align the laser beam 203 with the two substrate chucks. As described above, when substrates pass through the apparatus, the centerline of the substrate side wall can be fixed between the two substrate chucks 200 and 201. With an active alignment to the apparatus, the laser beam 203 can stay focused on the centerline of the substrate side wall.

When substrates pass through the apparatus, the laser irradiation initiates the substrate slicing process along the centerline of the substrate side wall. For square-shaped substrates, the laser beam/substrate slicing can start across the substrate side wall (from Points 205 to 206 in FIG. 4) at the same time. For round-shaped wafers, the laser irradiation/substrate slicing may start from a single point on the wafer instead.

It is conceivable to continue the substrate slicing process by feeding the substrate through the chuck assembly toward the focal point of the laser irradiation. Coupled with a laser line beam/scan, the slicing process can propagate into the substrate. During the substrate slicing process, the substrate has two resulting areas (after the slicing) and one starting area (prior to the slicing). In a continuous substrate slicing process by laser irradiation as proposed in the present invention, the laser irradiation must pass through the gap between the two resulting substrate areas to reach the location of substrate slicing. A viable substrate slicing process needs to produce a cut as narrow as a few microns. As every optical system has a finite Depth of Focus, a clearance between two resulting substrate areas after the slicing is necessary for the laser irradiation to reach the location of the substrate slicing. If the two resulting areas are straight planes, much of laser irradiation, even with the best possible collimation, may not pass through the gap in between to reach the location of substrate slicing.

In embodiments of the present invention, the two resulting substrate areas after the slicing are spread out to obtain such required clearance for laser irradiation to the active location of substrate slicing. As illustrated in FIG. 5, the gap can increase between two opposite-facing chucks 210A/210B and 211A/211B past the location of substrate slicing 212 in the direction of substrate exiting the apparatus. From a side view, two resulting substrate areas 213/214 and the starting substrate area 215 form an approximate "Y" configuration, with the location of laser irradiation/substrate slicing 212 at the center point in the "Y".

In the methods of the present invention, there can be at least two portions of opposite-facing substrate chucks 210A/210B and 211A/211B as illustrated in FIG. 5. The first portion of substrate chucks 210A and 211A are in a general alignment parallel to each other. As described above, side wall of a substrate passing through the gap between such portion of the substrate chucks can be aligned to a laser irradiation for substrate slicing. The gap between the second portion of two substrate chucks 210B and 211B gradually increases to pull apart the two resulting substrate areas after the slicing. In one approach, the first portion and second portion of each substrate chuck can be designed as one integrated unit with a continuous surface, as shown in FIG. 5 (210A and 210B, 211A and 211B). In another approach, the first portion and second portion of each substrate chuck can be designed as two units adjacent to each other as shown in FIG. 6 (220 and 222, 221 and 223). The second set of substrate chucks 222 and 223 can be operated independently from the first pair of substrate chucks 220 and 221. The two approaches share the same concept of spreading out the two resulting areas of the substrate after slicing, yet can have some differences in design details and operation modes.

The present invention takes advantage of the flexible nature of thin semiconductor substrates in the intended applications of the substrate slicing process. For instance, nominal substrate thickness has dropped to <200 microns in crystalline silicon solar cell production, thus the resulting wafer after a substrate slicing step can be <100 microns in thickness. A silicon substrate of such thickness is flexible. As a result, a curved surface design can be adopted for the second portion of the substrate chucks 210B and 211B as shown in FIG. 5, or for the second pair of the substrate chucks 222 and 223 as shown in FIG. 6. The design can yield a clearance for the laser irradiation onto the location for substrate slicing. The design of chuck surface curvature needs to take into account factors such as substrate thickness, substrate mechanical property, substrate quality and integrity of film stacks on the substrates. A thinner semiconductor substrate is in general more flexible, and can require less chucking force to be compliant to a curved chuck surface. On the other hand, a thinner semiconductor substrates can be more fragile and must be handled with additional care.

In the discussions above, the two resulting substrate areas after the slicing are separated by chucking forces of the substrate chucks. The substrate separation can also be achieved by some other methods. In one embodiment of the present invention, an electrostatic charge can be applied to the substrate, and two resulting substrate areas after the slicing can be separated by the electrostatic repulsion force.

A laser irradiation requires a pass to the substrate free of absorption in the laser wavelength. In addition, an irradiation of high power laser beam on semiconductor materials requires an ambient free of oxidant and contamination for substrate surfaces. It is conceivable to have the laser irradiation apparatus operated in an inert ambient. In addition, many non-contact chucks comprise a fluid-mechanical design with a purge gas as the fluid. If non-contact chucks are adopted in the apparatus as illustrated in FIGS. 5 and 6, a purge gas without absorption at the wavelength of laser irradiation can be selected for the chuck operation.

The sections above discussed apparatus for a direct laser irradiation on the wafer side wall for substrate slicing. As discussed earlier, another approach for substrate slicing comprises of a laser scan across the substrate surface to form a plane of modified region inside the substrate, and in a subsequent step the substrate can be cleaved along the plane of modified region. In order to cleave the substrate from the sidewall into two pieces of approximately half thickness, the laser irradation apparatus must accommodate the substrate thickness variation to maintain a laser convergence point in the middle between substrate front and back surfaces. As illustrated in FIG. 7, an apparatus for laser irradiation can comprise two parallel and opposite-facing substrate chucks 230 and 231, with substrate 232 passing through the gap in between. As the two substrate chucks 230 and 231 function as tandem springs, the middle of substrate 232 thickness is aligned with the center of the gap between the two substrate chucks. In one approach, one of the substrate chucks can comprise an aperture 233 for laser irradiation onto the substrate. In another approach, the apparatus can include a window instead of an aperture for laser irradiation. In yet another approach, the chucks can be made of materials transparent to the laser wavelength and the laser beam can pass directly through the chuck and illuminate onto the substrate.

Some single crystal materials such as silicon can be mechanically cleaved, preferably along certain crystal orientations. As discussed above, a thin substrate can be separated into two pieces of approximately half of the thickness by a combination of laser irradiation and mechanical cleaving steps. In one approach, a laser irradiation and materials ablation can prepare a groove on the substrate side wall. In another approach, a laser irradiation can generate a plane of modified region between substrate front and back surfaces. In both approaches, it is conceivable to split the substrate from side wall in a subsequent mechanical cleaving step.

Another embodiment of the invention addresses the apparatus design for the mechanical cleaving of the substrate. In order to separate a thin substrate along a plane in a general direction parallel to substrate front/back surfaces, the substrate needs to be held with uniform and balanced forces from both sides. In the proposed method of the present invention, the apparatus can again comprise an assembly of two opposite-facing substrate chucks, as illustrated in FIG. 8. The first portion of non-contact substrate chucks 241A and 242A are in a general alignment parallel to each other to center the substrate 240 passing through the unit. The gap between the two substrate chucks increases in the second portion 241B and 242B along the wafer exiting direction. A curved surface design can be adopted for the second portion of the two substrate chucks 241B and 242B to handle fragile thin substrate materials. The first portion and second portion of each chuck (241A and 241B, 242A and 242B) can be one integrated unit, or designed/manufactured as two units adjacent to each other. With a mechanical cleaver 243 positioned at the transition point between the first and second portions of the substrate chucks (241A to 241B, 242A to 242B), the substrate can be split from its side wall. The mechanical cleaver can be a wedge, a cutting wire or of some other shapes.

As discussed above, a substrate slicing process can be carried out with decoupled laser irradiation and mechanical cleaving steps. With decoupled laser irradiation and substrate slicing processes, a few process steps can be sandwiched in between in the overall manufacturing flow. It can be advantageous in fabrication of double-sided devices. For instance, a laser irradiation step can be first completed on bare substrates to form the plane of modified region inside the substrate, yet the substrate slicing step can be deferred until after completion of several double-sided processes in double-sided device fabrication.

On the other hand, if back-to-back laser irradiation (on substrate surface) and mechanical cleaving steps for substrate slicing can be accommodated in the device process flow, it can be desirable to combine the two processes in a single manufacturing tool. Compared with two separate manufacturing equipments, an integrated laser irradiation and mechanical cleaving tool can yield a lower production cost and a shorter work-in-process (WIP) time. FIG. 9 illustrates a possible setup for such a laser irradiation/mechanical cleaving tool. A substrate 250 passes through the opening between two opposite-facing substrate chucks 251A/251B and 252A/252B. A portion of two substrate chucks 251A and 252A are in a general alignment parallel to each other, with the substrate centered in between. A laser irradiation 254 illuminates on the substrate surface through a window 251C on one of the substrate chucks, e.g. to form a plane of modified region inside the substrate. A mechanical cleaver is positioned at end of the parallel portion of the substrate chucks 251A and 252A to split the substrate along the plane of modified region, and the gap increases between the second portion of the two substrate chucks 251B and 252B to spread out the resulting substrates after the slicing.

The next set of embodiments in the present invention extend laser irradiation/substrate separation processes from a thin substrate in a wafer form to a workpiece in a general shape of a cylindrical ingot. As illustrated in FIG. 10, it is conceivable to have a laser irradiation 300 onto side wall of an ingot 301 from a tangential direction, and to separate a continuous layer of materials 302 from the ingot side wall. It can be advantageous to have a laser beam with a very narrow line profile. A very narrow laser line beam can maximize fluence en route to a high substrate separation rate. The Kerf loss (from laser-induced materials ablation) can also be minimized. Such narrow laser beam can be produced with a short wavelength laser coupled with advanced laser optics. The laser beam in the embodiment can also take on a profile different from a continuous narrow line. The laser beam can be shaped as a short line, an elliptical spot or a circular spot. In addition, the laser beam can focus on a single spot, or several spots in an alignment to form a "broken" line, etc. In these scenarios, a laser irradiation across the entire length of the ingot can be accomplished by scanning the laser beam or moving the substrate.

In the proposed method, a thin layer of single-crystal materials (e.g. <100 micron thickness) can be produced directly from an ingot with a minimal kerf loss. Such thin layer of single-crystal semiconductor (e.g. Si) materials can be attractive in various flexible display and flexible electronics applications. In addition, a thin sheet can be a preferred form for substrate handling in device fabrication processes. Thin semiconductor substrates of <100 um can be very flexible and difficult to handle in a wafer form. In comparison, a thin flexible layer of materials separated from an ingot by the methods in the present invention can be processed in so-called "roll-to-roll" manufacturing equipments. Such roll-to-roll manufacturing processes can be desirable with its high productivity, low production cost, flexibility in fabrication of double-sided electronic devices, and opportunities in integration of manufacturing steps.

FIG. 10 also illustrates apparatus setup for the substrate separation processes on a cylindrical ingot as claimed in the present invention. A substrate chuck 304 can be positioned next to the rotating ingot across the length of the ingot side wall, right at the location of laser irradiation/substrate separation. The substrate chuck pulls away the thin layer of materials after its separation from the ingot. At the same time, the cylindrical ingot surface also rotates away from the point of substrate separation. From a side view, the configuration in FIG. 10 is analogous to the setup for the direct slicing of thin wafers by laser irradiation on the side wall as illustrated in FIGS. 5 and 6, in which the two resulting substrate areas after slicing are spread out for the laser irradiation clearance.

A cyclindrical substrate chuck is shown in FIG. 10. The curved surface design is adopted to handle fragile thin substrate materials, yet a substrate chuck of other shapes can also be applicable. The substrate chuck can adopt either a contact or a non-contact design. As shown in FIG. 10, a substrate chuck in contact with the ingot can rotate at a direction (clockwise/counterclockwise) opposite to the ingot. In another approach, a non-contact substrate chuck can stay stationary while the thin layer of materials separated from the ingot is rolled out following the chuck surface.

In the discussions above, the thin layer of materials after the slicing is separated from the ingot by chucking force of the substrate chuck. The substrate separation can also be achieved by some other methods. In one embodiment of the present invention, an electrostatic charge can be applied to the ingot, and the thin layer of materials after the slicing can be separated from the ingot by the electrostatic repulsion force.

It can be desirable to have a uniform thickness for the resulting layer of materials after separation. In the direct substrate separation by laser irradiation as illustrated in FIG. 10, the thickness of such thin layer of materials equals to the distance between the starting ingot side wall 306 and location of laser irradiation 303. Meanwhile, the working distance between the ingot side wall 306 and the cylindrical chuck 304 is a constant. It is thus conceivable to separate a thin layer of uniform thickness from an ingot by fixing the relative position of the laser irradiation with respect to the chuck side wall. It can be advantageous to implement laser irradiation sensor(s) in the apparatus, and use the signals in a precise control of the laser/chuck alignment. Separation of a continuous layer of materials from the ingot reduces the ingot radius. The rate of the ingot radius reduction can be determined from the rate of materials separation and the thickness of the resulting layer of materials after separation. To maintain the working distance between the ingot side wall and the chuck, the center position 307 of the ingot 301 must gradually move toward the chuck 304. The required motion can be calculated and precisely controlled. In addition, the ingot can also be pulled toward the substrate chuck by the chucking force.

In the method as illustrated in FIG. 10, a thin layer of materials is separated from the ingot at the location of laser irradiation 303. This is analogous to the direct wafer slicing by a laser irradiation on the wafer side wall as shown in FIGS. 1 and 4-6. Similar to substrate slicing methods described above for thin wafers, there are other approaches for laser irradiation and substrate separation with a cylindrical ingot as the workpiece. In another method of the present invention as illustrated in FIG. 11, a laser beam 310 irradiates on a cyclindrical ingot 311 from a radial direction and converges at a focal point 312 under the ingot sidewall surface. With a laser scan over length of a rotating ingot, a plane of modified region 313 can be formed inside the substrate, before a layer of materials 314 can be separated from the ingot along the plane of modified region at location 315. In this approach, the location of materials separation 315 is different from the focal point of laser irradiation 312. It is analogous to the wafer slicing process described above with separate laser irradiation and substrate slicing steps as illustrated in FIGS. 2 and 7-9.

As shown in FIG. 11, a mechanical cleaver 317 can be adopted to separate the thin layer of materials from the ingot along the plane of modified region generated by the laser irradiation. The mechanical cleaver can be a wedge, a cutting wire or of some other shapes. In addition, a substrate chuck 316 can be placed next the ingot at the location of substrate separation for rolling out the thin layer of materials. The resulting layer of materials thickness is determined by the depth of the plane of modified region 313 underneath the ingot sidewall surface.

In the apparatus illustrated in FIG. 11, the thin layer of materials is separated from the ingot by a mechanical cleaver 317, and is rolled out by a cylindrical chuck 316 next to the ingot side wall. In such configuration, the mechanical cleaver must be aligned to the plane of modified region 313, and the working distance between ingot side wall and chuck surface needs to be maintained at the same time. As a result, the apparatus illustrated in FIG. 11 must have a precision control of relative positions of three units: a) ingot; b) laser irradiation; c) mechanical cleaver/cylindrical chuck assembly for substrate separation. The automation and precision control of the apparatus can be based on the predictive ingot radius reduction and laser irradiation sensor(s) signals. Meanwhile, the relative position of the ingot side wall to the substrate chuck is maintained by the chucking force.

In some final embodiments of the present invention, a film can be deposited on or bonded to the ingot side wall prior to the separation of the thin layer of materials from the ingot. The proposed methods and configurations of the apparatus are illustrated in FIGS. 12 and 13. The film 320 can be deposited or laminated onto the ingot surface. Various films can be considered for the process. Some films 320 can facilitate the substrate separation by inducing a tencile stress on the ingot side wall. Some films can serve as a support to the thin layer of materials after separation from the ingot. Some films can also be an integral part of the final devices fabricated on the resulting thin layer of materials.

The proposed method of substrate separation in FIG. 13 is similar to that illustrated in FIG. 11, in which a laser irradiation on the ingot side wall is followed by a subsequent materials separation. There is a choice to deposit/bond the support materials 320 either before or after the laser irradiation. Some materials can not sustain high-density laser irradiation, or can be detrimental to laser transmission and convergence inside the substrate. It is desirable to deposit/bond such materials onto the substrate surface after the laser irradiation, as illustrated in FIG. 13. On the other hand, some other materials/films can be beneficial to laser transmission and its convergence inside the substrate. It is desirable to coat these materials/films on the ingot side wall prior to the laser irradiation.

What is claimed is:

1. An apparatus adapted to handle a semiconductor wafer, comprising:
    a first chuck;
    a second chuck spaced apart from the first chuck;
    an opening in between the first chuck and the second chuck such that the semiconductor wafer can pass through, wherein the opening increases as the semiconductor wafer moves through the apparatus after being separated; and
    a mechanism for separating the semiconductor wafer into at least two pieces as the semiconductor wafer moves through the opening, wherein each of the two pieces after the separation comprises substantially the same surface area of the semiconductor wafer prior to the separation.

2. An apparatus according to claim 1, wherein said first and second chucks are substantially mirror images to each other in design.

3. An apparatus according to claim 1, wherein said first and second chucks are designed, positioned and operated such that the semiconductor wafer does not make contact with the chucks when the semiconductor wafer moves through the opening.

4. An apparatus according to claim 1, wherein a portion of the first chuck is in a general alignment parallel to a portion of the second chuck as the semiconductor wafer moves through the apparatus before being separated.

5. An apparatus according to claim 1 further comprising a laser irradiation system adapted to illuminate the side wall of the semiconductor wafer as the semiconductor wafer moves through the opening.

6. An apparatus according to claim 5, wherein the laser irradiation system comprises laser irradiation sensor(s).

7. An apparatus according to claim 5 further comprising a closed-loop control system to operate the apparatus with signals from the laser irradiation sensor(s).

8. An apparatus according to claim 1 further comprising an ion beam to illuminate the semiconductor wafer as the wafer moves through the opening.

9. An apparatus according to claim 1, comprising a device adapted to apply an electrostatic charge on said semiconductor wafer.

10. An apparatus according to claim 1 further comprising a unit capable of delivering purge gas to the semiconductor wafer.

11. An apparatus according to claim 1, wherein the mechanism for separating the semiconductor wafer comprises a mechanical cleaver.

12. An apparatus adapted to handle a semiconductor ingot, comprising:
    a mechanism to rotate the ingot;
    a unit to illuminate a laser on side wall of the ingot; and
    a mechanism to separate a thin layer of materials from the ingot, wherein the mechanism comprises a mechanical cleaver.

13. An apparatus adapted to handle a semiconductor wafer, comprising:
    a first chuck;
    a second chuck spaced apart from the first chuck;
    an opening in between the first chuck and the second chuck such that the semiconductor wafer can pass through, wherein said first and second chucks are designed, positioned and operated such that the semiconductor wafer does not make contact with the chucks when the semiconductor wafer moves through the opening;
    and a mechanism for separating the semiconductor wafer into at least two pieces as the semiconductor wafer moves through the opening, wherein each of the two pieces comprises substantially the same surface area of the semiconductor wafer prior to the separation.

14. An apparatus adapted to handle a semiconductor wafer, comprising:
    a first chuck;
    a second chuck spaced apart from the first chuck;
    an opening in between the first chuck and the second chuck such that the semiconductor wafer can pass through; and
    a mechanism for separating the semiconductor wafer into at least two pieces as the semiconductor wafer moves through the opening, wherein each of the two pieces comprises substantially the same surface area of the semiconductor wafer prior to the separation.

15. An apparatus adapted to handle a semiconductor ingot, comprising:
    a mechanism to rotate the ingot;
    a chuck positioned next to a sidewall of the ingot;
    a unit to illuminate a beam on the sidewall of the ingot, wherein the beam is in general alignment perpendicular to the front and back surfaces of the ingot, and wherein the beam intercepts with front and back surfaces of the ingot; and
    a mechanism to separate a thin layer of materials from the sidewall of the ingot, wherein the thin layer of materials after separation is in a general alignment perpendicular to front and back surfaces of the ingot, and wherein the thin layer of materials intercepts with front and back surfaces of the ingot .

16. An apparatus according to claim 15, wherein the beam illuminates on the sidewall from a tangential direction.

17. An apparatus according to claim 15, wherein the beam illuminates on the sidewall from a radial direction.

18. An apparatus according to claim 15, wherein the said chuck is designed, positioned and operated such that the ingot does not make contact with the chuck when the thin layer of materials is separated from the sidewall of the ingot.

19. An apparatus according to claim 15 further comprising a unit to apply an electrostatic charge on said ingot.

20. An apparatus according to claim 15 further comprising laser irradiation sensor(s) adapted to illuminate the sidewall.

21. An apparatus according to claim 20, further comprising a closed-loop control system to operate the apparatus with signals from said laser irradiation sensor(s).

* * * * *